(12) United States Patent
Lee et al.

(10) Patent No.: US 8,599,336 B2
(45) Date of Patent: Dec. 3, 2013

(54) LIQUID CRYSTAL DISPLAY DEVICE AND METHOD OF FABRICATING THE SAME

(75) Inventors: Jung-Il Lee, Goyang-si (KR); In-Jae Chung, Gwacheon-si (KR); Kang-Il Kim, Seoul (KR); Gi-Sang Hong, Gwangju (KR)

(73) Assignee: LG Display Co., Ltd., Seoul (KR)

( * ) Notice: Subject to any disclaimer, the term of this patent is extended or adjusted under 35 U.S.C. 154(b) by 298 days.

(21) Appl. No.: 13/100,915

(22) Filed: May 4, 2011

(65) Prior Publication Data
US 2011/0273648 A1 Nov. 10, 2011

(30) Foreign Application Priority Data

May 5, 2010 (KR) .................. 10-2010-0042208

(51) Int. Cl.
*G02F 1/1335* (2006.01)
(52) U.S. Cl.
USPC ........................................................ 349/106
(58) Field of Classification Search
None
See application file for complete search history.

(56) References Cited

U.S. PATENT DOCUMENTS

| 7,564,531 | B2 | 7/2009 | Yasuda et al. | |
|---|---|---|---|---|
| 2003/0112393 | A1 | 6/2003 | Watanabe et al. | |
| 2004/0125303 | A1 | 7/2004 | Chung | |
| 2010/0075451 | A1* | 3/2010 | Yoo et al. | 438/34 |
| 2011/0141392 | A1* | 6/2011 | Noh | 349/61 |
| 2011/0255021 | A1* | 10/2011 | Ohue | 349/43 |
| 2011/0299024 | A1* | 12/2011 | Lee et al. | 349/144 |
| 2012/0314164 | A1* | 12/2012 | Suyama | 349/106 |

FOREIGN PATENT DOCUMENTS

| CN | 01677058 A | | 3/2010 | |
|---|---|---|---|---|
| DE | 10 2005 030 672 A1 | | 7/2006 | |
| JP | 05265040 A | * | 10/1993 | G02F 1/136 |

* cited by examiner

*Primary Examiner* — Sung Pak
(74) *Attorney, Agent, or Firm* — McKenna, Long & Aldridge, LLP.

(57) ABSTRACT

A liquid crystal display device includes first and second substrates facing each other, wherein a pixel region is defined on the first and second substrates, first and second grooves formed on an inner surface of the first substrate, a gate line formed in the first groove along a direction, a common line formed in the second groove and parallel to the gate line, a data line crossing the gate line to define the pixel region, a thin film transistor connected to the gate line and the data line, and a light-shielding pattern of a black inorganic material and around the gate line, the data line and the common line.

16 Claims, 17 Drawing Sheets

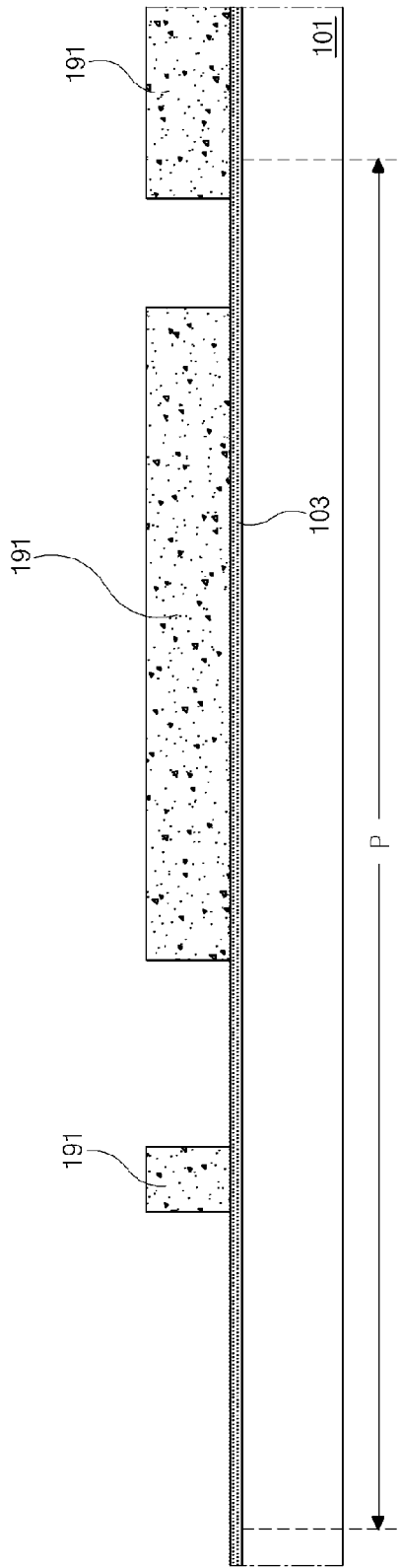
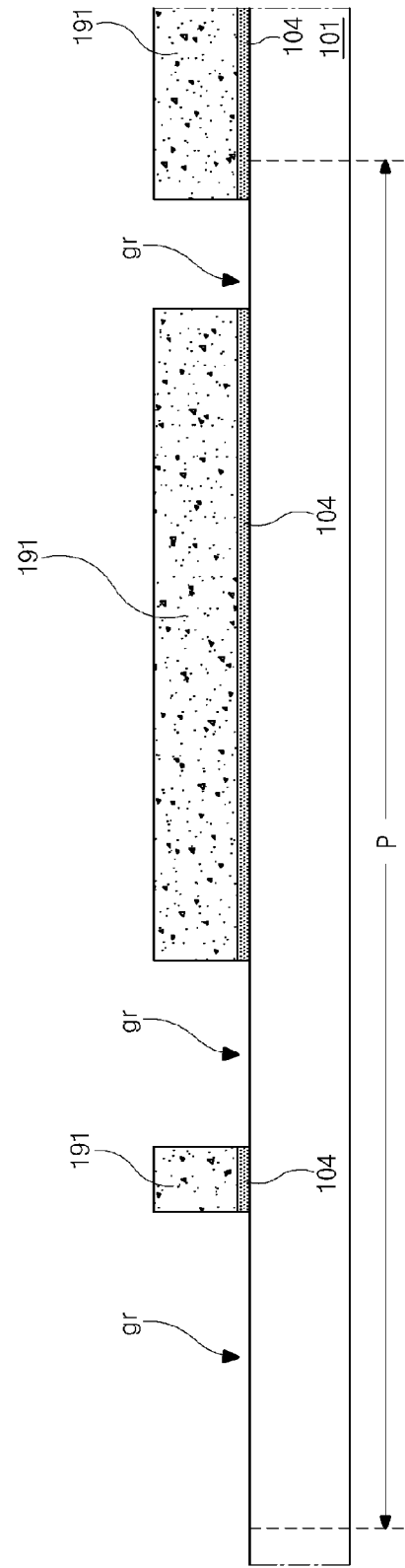
FIG. 8A
FIG. 8B

LIQUID CRYSTAL DISPLAY DEVICE AND METHOD OF FABRICATING THE SAME

This application claims the benefit of Korean Patent Application No. 10-2010-0042208 filed in Korea on May 5, 2010, which is hereby incorporated by reference for all purposes as if fully set forth herein.

BACKGROUND OF THE INVENTION

1. Field of the Invention

The invention relates to a liquid crystal display device, and more particularly, to a liquid crystal display device having an improved aperture ratio and a method of fabricating the same.

2. Discussion of the Related Art

Generally, a liquid crystal display (LCD) device uses optical anisotropy and polarization properties of liquid crystal molecules. The liquid crystal molecules have a definite alignment direction as a result of their thin and long shapes. The alignment direction of the liquid crystal molecules can be controlled by applying an electric field across the liquid crystal molecules.

In other words, as the intensity or direction of the electric field is changed, the alignment of the liquid crystal molecules also changes. Since incident light is refracted based on the orientation of the liquid crystal molecules due to the optical anisotropy of the liquid crystal molecules, images can be displayed by controlling the light transmittance of the liquid crystal material.

Since the LCD device including thin film transistors as a switching element, referred to as an active matrix LCD (AM-LCD) device, has excellent characteristics of high resolution and displaying moving images, the AM-LCD device has been widely used.

The AM-LCD device includes an array substrate, a color filter substrate and a liquid crystal layer interposed therebetween. The array substrate may include a pixel electrode and thin film transistor, and the color filter substrate may include a color filter layer and a common electrode. The AM-LCD device is driven by an electric field between the pixel electrode and the common electrode to have excellent properties of transmittance and aperture ratio. However, since the AM-LCD device uses a vertical electric field that is perpendicular to the substrates, the AM-LCD device has poor viewing angles.

An LCD device having a wide viewing angle property has been suggested and developed to resolve the above-mentioned limitations.

FIG. 1 is a cross-sectional view of a related art LCD device. As shown in FIG. 1, the related art LCD device includes an upper substrate 9 and a lower substrate 10 spaced apart from and facing each other. A liquid crystal layer 11 is interposed between the upper and lower substrates 9 and 10. A common electrode 17 and a pixel electrode 30 are formed on the lower substrate 10. The common electrode 17 and the pixel electrode 30 may be disposed on the same level. Liquid crystal molecules of the liquid crystal layer 11 are driven by a horizontal electric field L, which is induced between the common and pixel electrodes 17 and 30. Although not shown in the figure, a color filter layer is formed on the upper substrate 9. The upper substrate 9 including the color filter layer may be referred to as a color filter layer. The lower substrate 10 including the common electrode 17 and the pixel electrode 30 may be referred to as an array substrate.

FIGS. 2A and 2B are cross-sectional views showing turned on/off conditions, respectively, of a related art LCD device. As shown in FIG. 2A, when the voltage is applied to the LCD device, arrangement of liquid crystal molecules 11a above the common electrode 17 and the pixel electrode 30 is unchanged. However, liquid crystal molecules 11b between the common electrode 17 and the pixel electrode 30 are horizontally arranged due to the horizontal electric field L. Since the liquid crystal molecules 11b are arranged by the horizontal electric field L, the LCD device has a wide viewing angle property. For example, the LCD device has a viewing angle of about 80 degrees to about 85 degrees up and down and right and left without an image inversion or a color inversion.

FIG. 2B shows a condition when the voltage is not applied to the LCD device. Because an electric field is not induced between the common and pixel electrodes 17 and 30, the arrangement of liquid crystal molecules 11 of the liquid crystal layer is not changed.

FIG. 3 is a plan view schematically illustrating a pixel region of a related art LCD device, and FIG. 4 is a cross-sectional view taken along the line IV-IV of FIG. 3.

As shown in FIGS. 3 and 4, an array substrate of the related art LCD device 40 includes a gate line 43, a common line 47 and a data line 60 on a first substrate 41. The gate line 43 is formed along a horizontal direction, and the common line 47 is parallel to the gate line 43. The data line 60 crosses the gate line 43 and the data line 47 and defines a pixel region P with the gate line 43.

A thin film transistor Tr is formed at a crossing portion of the gate and data lines 43 and 60. The thin film transistor Tr includes a gate electrode 45, a semiconductor layer 50, a source electrode 53 and a drain electrode 55. The source electrode 53 extends from the data line 60, and the gate electrode 45 extends from the gate line 43.

Pixel electrodes 70 and common electrodes 49a and 49b are formed in the pixel region P. The pixel electrodes 70 are electrically connected to the drain electrode 55 through a drain contact hole 67. The common electrodes 49a and 49b are parallel to the pixel electrodes 70 and are alternately arranged with the pixel electrodes 70. The common electrodes 49a and 49b extend from the common line 47.

A color filer layer 85 is formed on an inner surface of a second substrate 81 of a color filter substrate opposite to the array substrate. An overcoat layer 87 is formed on the color filter layer 85. A black matrix 83 is formed to correspond to boundaries of each pixel region P.

Here, the common electrodes 49a disposed adjacently to the data line 60 may be referred to as outer common electrodes. In this case, the outer common electrodes 49a are spaced apart from the data line 60 with a pre-determined distance, more particularly, more than 3 μm. This is to minimize effects on an electric field induced between the common electrodes 49a and 49b and the pixel electrodes 70 due to the data line 60. Further, this is to prevent a parasitic capacitance between the outer common electrodes 49a and the data line 60.

Therefore, light leakage may occur in an area between the data line 60 and the outer common electrodes 49a, and to prevent the light leakage, the black matrix 83 of the color filter substrate has a width such that the black matrix 83 overlaps the data line 60 and the outer common electrodes 49a. However, the aperture ratio of the pixel region p is lowered due to this structure.

SUMMARY OF THE INVENTION

Accordingly, the present invention is directed to a liquid crystal display device and a method of fabricating the same that substantially obviate one or more of the problems due to limitations and disadvantages of the related art.

An object of the present invention is to provide a liquid crystal display device and a fabricating method of the same that improve the aperture ratio by minimizing an area where light leakage occurs.

Another object of the present invention is to provide a liquid crystal display device and a fabricating method of the same that minimize the parasitic capacitance between the data line and the outer common electrodes.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of embodiments of the invention, as embodied and broadly described, a liquid crystal display device includes first and second substrates facing each other, wherein a pixel region is defined on the first and second substrates, first and second grooves formed on an inner surface of the first substrate, a gate line formed in the first groove along a direction, a common line formed in the second groove and parallel to the gate line, a data line crossing the gate line to define the pixel region, a thin film transistor connected to the gate line and the data line, and a light-shielding pattern of a black inorganic material and around the gate line, the data line and the common line.

In another aspect, a fabricating method of a liquid crystal display device includes forming an inorganic black material layer on a first substrate, on which a pixel region is defined, forming a photoresist pattern on the inorganic black material layer, removing the inorganic black material layer using the photoresist pattern as an etching mask to expose an inner surface of the first substrate, forming first and second grooves by removing the exposed inner surface of the first substrate, forming a gate line and a common line in the first groove and the second groove, respectively, and removing the photoresist pattern, forming a data line crossing the gate line to define the pixel region, and forming a thin film transistor connected to the gate line and the data line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 8A to 8K are cross-sectional views taken along the line VI-VI of FIG. 5 in steps of a method of fabricating the LCD device according to the embodiment of the invention.

DETAILED DESCRIPTION OF EXEMPLARY EMBODIMENTS

Reference will now be made in detail to exemplary embodiments of the invention, which are illustrated in the accompanying drawings.

Figure 5:
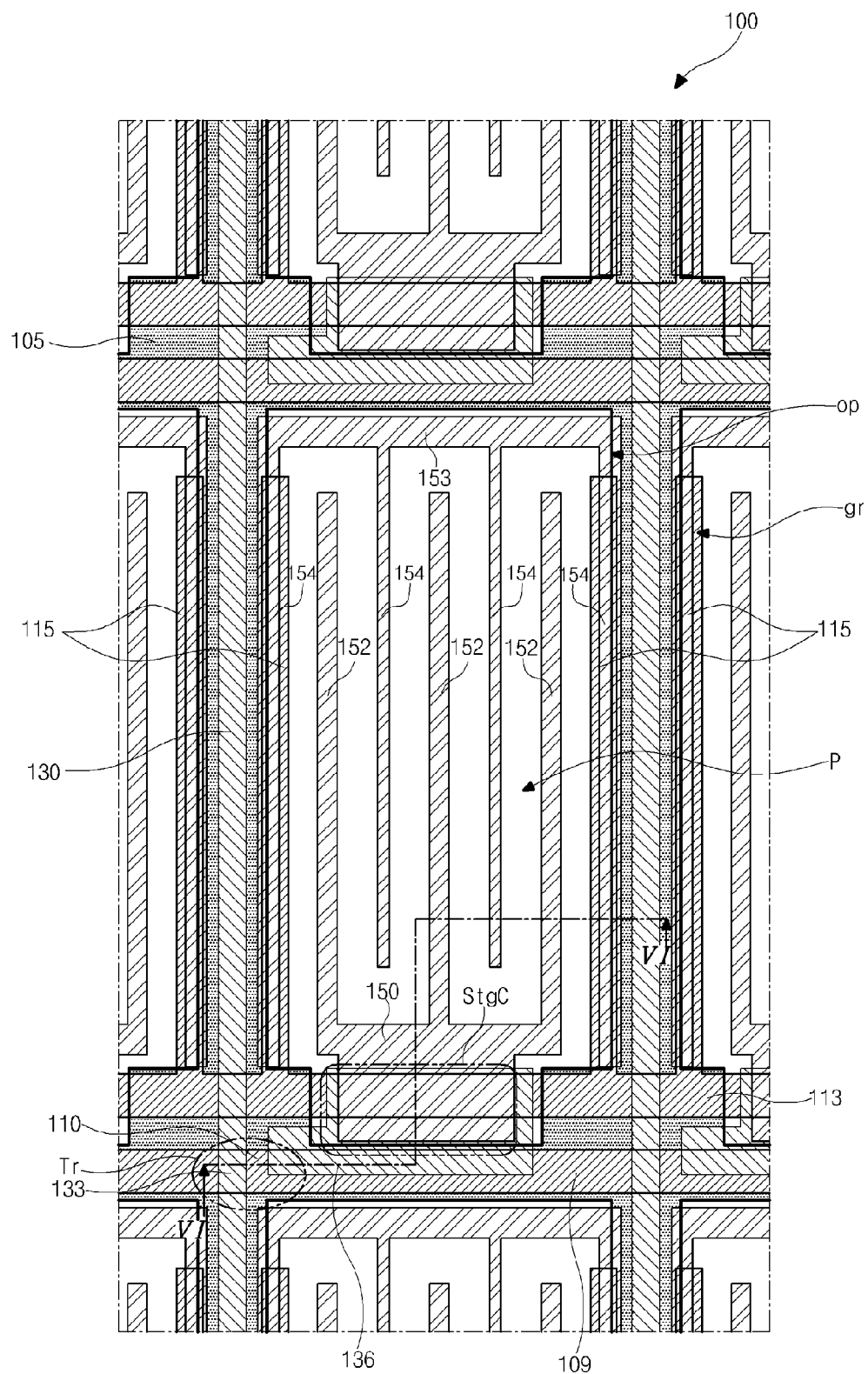
FIG. 5 is a plan view of schematic illustrating a pixel region of an LCD device according to an embodiment of the invention.
Figure 6:
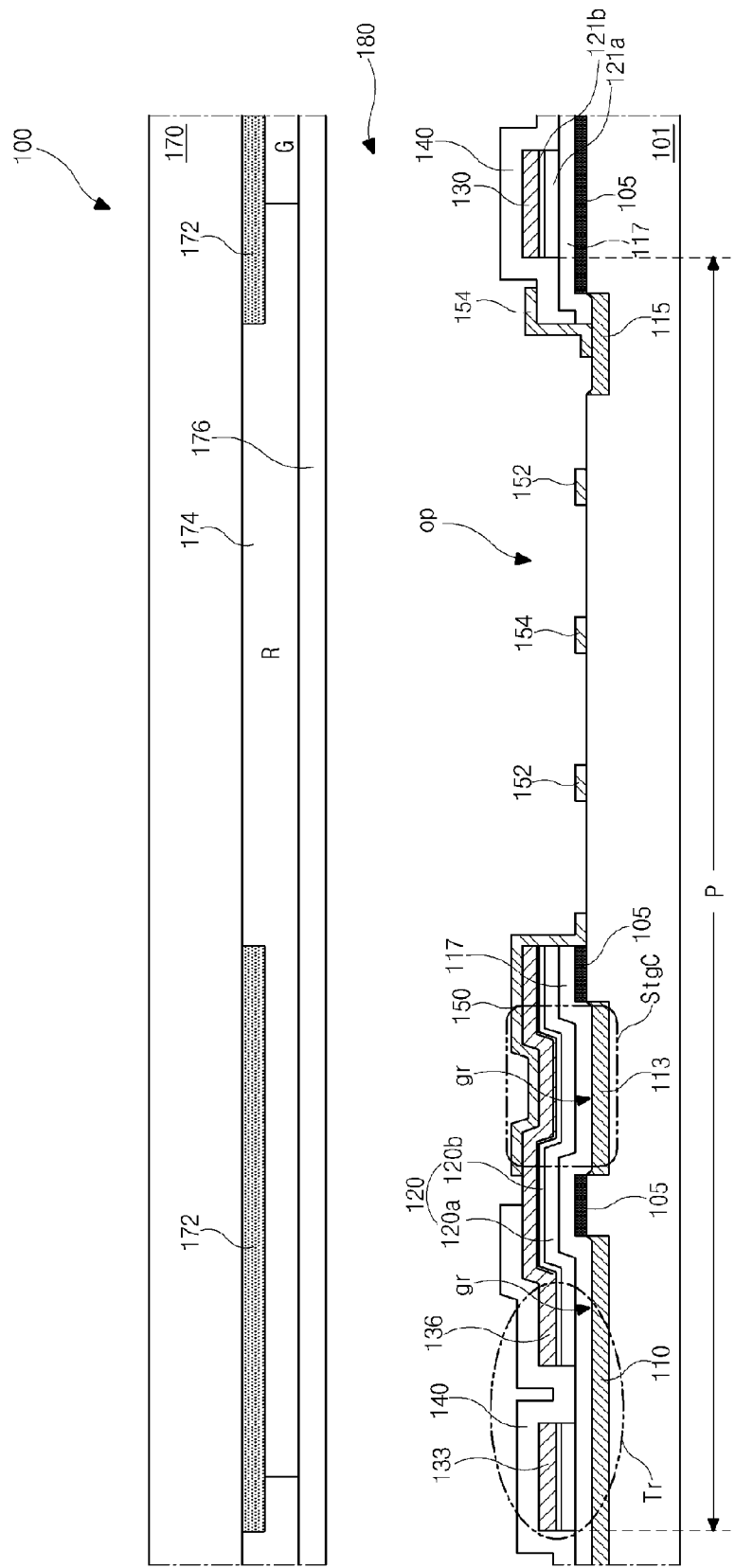
FIG. 6 is a cross-sectional view taken along the line VI-VI of FIG. 5.

FIG. 5 is a plan view of schematic illustrating a pixel region of a liquid crystal display (LCD) device according to an embodiment of the invention, and FIG. 6 is a cross-sectional view taken along the line VI-VI of FIG. 5.

In FIGS. 5 and 6, the LCD device 100 includes an array substrate and a color filter substrate spaced apart from and facing each other, and a liquid crystal layer 180 is interposed between the array substrate and the color filter substrate. The array substrate includes a thin film transistor Tr, common electrodes 154, and pixel electrodes 152 on a first substrate 101. The color filter substrate having a color filter layer 174 and a black matrix 182 on a second substrate 170.

The first substrate 101 of the array substrate has grooves gr corresponding to a gate line 109, a common line 113 and outer common electrodes 115 at an inner surface thereof. The gate line 109 and the common line 113 are spaced apart from each other corresponding to the grooves gr and extend along a first direction. The outer common electrodes 115 extend from the common line 113 along a second direction perpendicular to the first direction and are disposed at opposite sides of the pixel region P, respectively.

A data line 130 is formed along the second direction. The data line 130 crosses the gate line 109 and the common line 113 with a gate insulating layer 117 therebetween and defines the pixel region P. A thin film transistor Tr having a gate electrode 110, the gate insulating layer 117, a semiconductor layer 120, and source and drain electrodes 133 and 136 is formed at a crossing portion of the gate line 109 and the data line 130. In the embodiment of the invention, the thin film transistor Tr has a portion of the gate line 109 as the gate electrode 110. The thin film transistor Tr may have various shapes and structures. For example, the thin film transistor Tr may have a gate electrode, which extend from the gate line 109 along the second direction. The thin film transistor Tr may have a U-shaped channel, wherein an area between the source and drain electrodes 133 and 136 is U-shaped.

In addition, an inorganic black matrix pattern 105 is formed on the first substrate 101 to correspond to an area between the data line 130 and each outer common electrode 115 and an area between the gate line 109 and the common line 113. The inorganic black matrix pattern 105 may be formed of a black inorganic material, for example, germanium (Ge).

A passivation layer 140 is formed to cover the thin film transistor Tr. The passivation layer 140 has an opening op corresponding to the pixel region P and exposes the inner surface of the first substrate 101. Here, one end of the drain electrode 136 is exposed through the opening op of the passivation layer 140, and one side of each outer common electrode 115, which is farther from the data line 130 than another side of the outer common electrode 115, is also exposed through the opening op of the passivation layer 140.

The common electrodes 154 are formed on the inner surface of the first substrate 101 exposed through the opening op.

The common electrodes 154 are spaced apart from each other and are connected to an auxiliary common pattern 153. The common electrodes 154 contact the one side of each of the outer common electrodes 115 exposed through the opening op.

An auxiliary pixel pattern 150 is formed on the inner surface of the first substrate 101 and contacts the one end of the drain electrode 136. The pixel electrodes 152 extend from the auxiliary pixel pattern 150 and alternate with the common electrodes 154.

In the array substrate of the above-mentioned LCD device according to the embodiment of the invention, the inorganic black matrix pattern 105, which is formed of an inorganic material such as germanium and blocks light, is formed between the data line 130 and the outer common electrodes 115. Thus, light leakage can be prevented between the outer common electrodes 115 and the data line 130 differently from the related art LCD device.

The inorganic black matrix pattern 105 may not completely shield the area between the data line 130 and the outer common electrodes 115 due to processing errors. However, the area between the data line 130 and the outer common electrodes 115 is considerably narrowed as compared with the related art LCD device of FIG. 4 without the inorganic black matrix pattern 105, and thus light leakage can be remarkably reduced.

Figure 1:
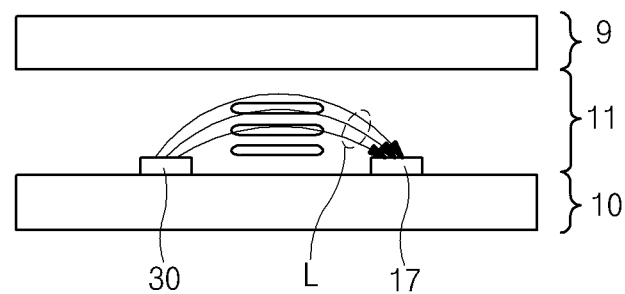
FIG. 1 is a cross-sectional view of a related art LCD device.
Figure 2A:
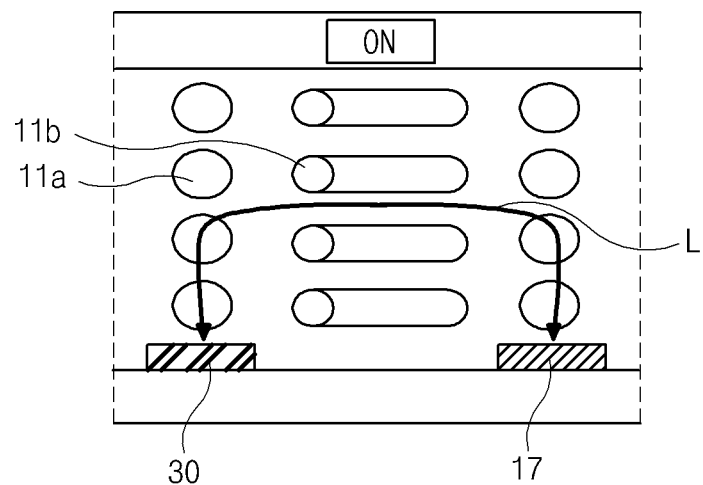
FIGS. 2A and 2B are cross-sectional views showing turned on/off conditions, respectively, of a related art LCD device.
Figure 2B:
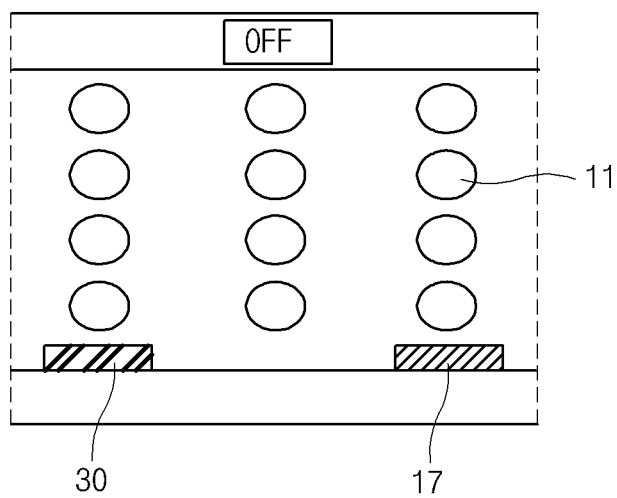
Figure 3:
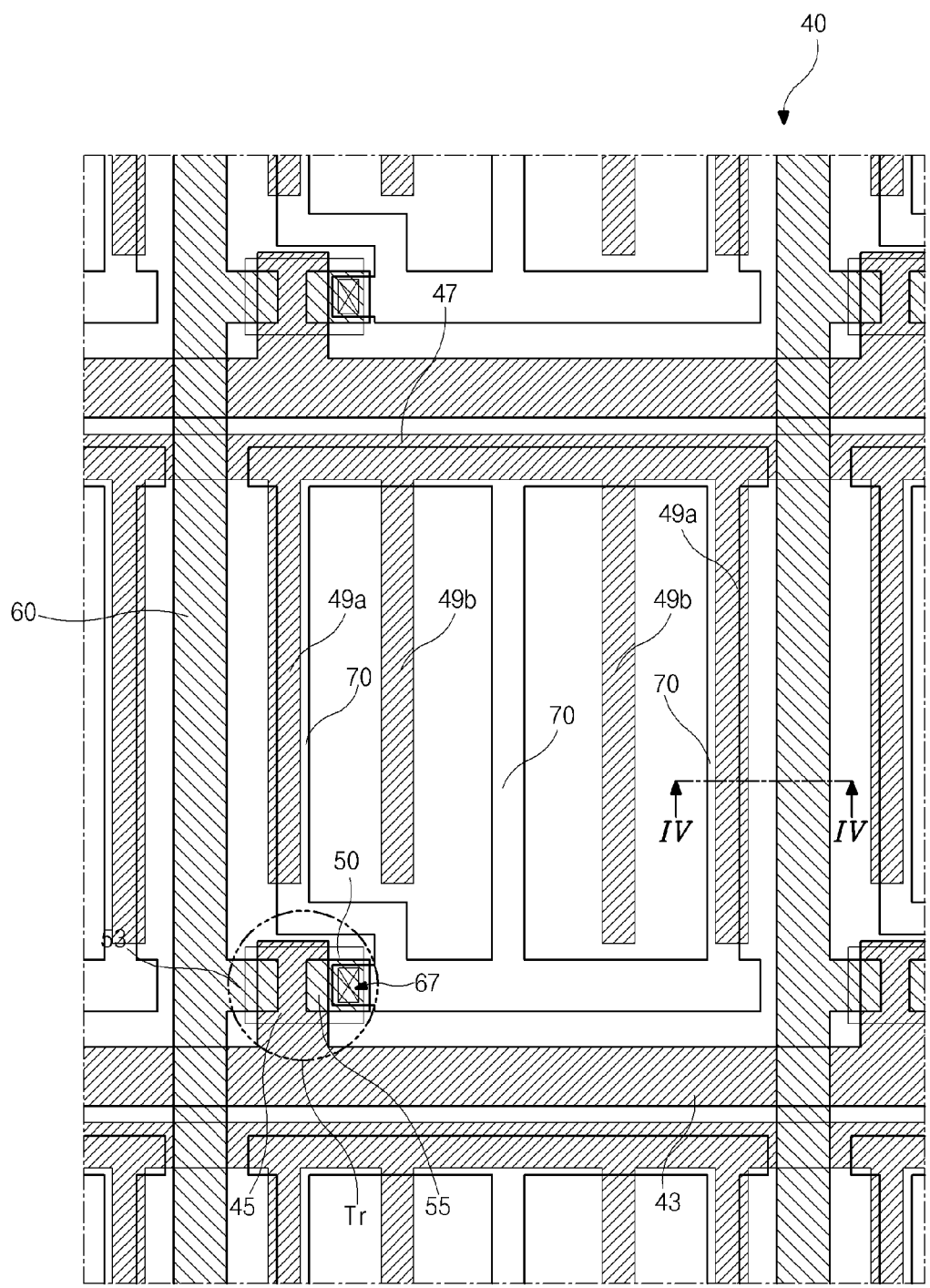
FIG. 3 is a plan view schematically illustrating a pixel region of a related art LCD device.
Figure 4:
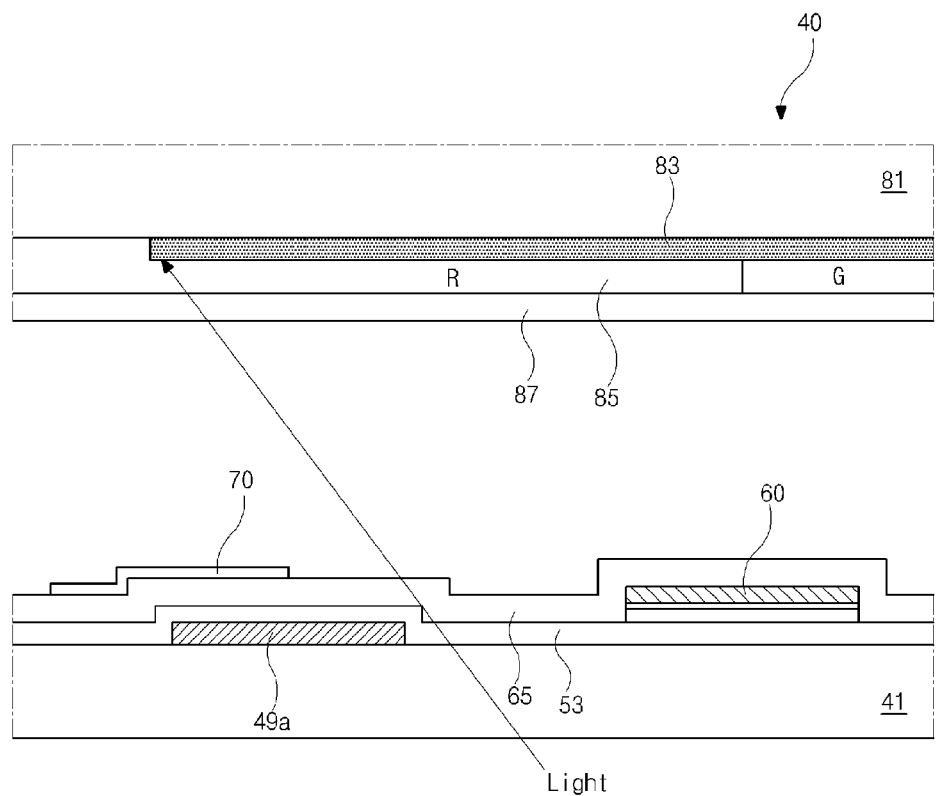
FIG. 4 is a cross-sectional view taken along the line IV-IV of FIG. 3.

Moreover, in the related art, since only the gate insulating layer 53 of FIG. 4 is interposed between the outer common electrodes 49a of FIG. 4 and the data line 60 of FIG. 4, to minimize a parasitic capacitance, the outer common electrodes 49a of FIG. 4 and the data line 60 of FIG. 4 are formed with a distance of more than 3 μm therebetween. On the other hand, in the invention, the inorganic black matrix pattern 105 and the gate insulating layer 117 are formed between the outer common electrodes 115 and the data line 130, and a parasitic capacitance between the outer common electrodes 115 and the data line 130 is decreased.

A color filter substrate faces the array substrate having the above-mentioned structure. The color filter substrate includes a color filter layer 174 and a black matrix 172 on an inner surface of a second substrate 170. The color filter layer 174 includes red, green and blue color filter patterns, which corresponds to respective pixel regions P and are sequentially repeated. The black matrix 172 corresponds to boundaries of the pixel region P.

Here, it is noted that the black matrix 172, which corresponds to the boundaries of the pixel region P, has a relatively narrow width corresponding to the data line 130 in comparison with the related art.

Meanwhile, a liquid crystal layer 180 is interposed between the array substrate and the color filter substrate to thereby constitute the LCD device 100 of the invention.

In the LCD device of the related art, the black matrix 83 of FIG. 4 on the color filter substrate has such a width that the black matrix 83 of FIG. 4 entirely overlaps the data line 60 of FIG. 4 and the outer common electrode 83 of FIG. 4 and a user does not see light leaked between the outer common electrode 49a of FIG. 4 and the data line 60 of FIG. 4.

On the other hand, in the LCD device 100 of the invention, the inorganic black matrix pattern 105 is formed between the outer common electrodes 115 and the data line 130. Therefore, there may not be light leakage between the outer common electrodes 115 and the data line 130, or an area where light is leaked may be reduced because the inorganic black matrix pattern 105 partially shields the area between the outer common electrodes 115 and the data line 130.

Accordingly, the black matrix 172 corresponding to the data line 130 can have a narrowed width as compared with the related art.

Referring to the figures, in the LCD device 40 of FIG. 4 of the related art, the black matrix 83 of FIG. 4 completely overlaps the outer common electrode 49a of FIG. 4 and covers both sides of the outer common electrode 49a of FIG. 4, whereby one side of the black matrix 83 of FIG. 4 is disposed nearer by a central portion of the pixel region than the both sides of the outer common electrode 49a of FIG. 4. In the LCD device of the invention, one side of the black matrix 172 overlaps and is disposed over the outer common electrode 115 adjacent to the data line 130 or overlaps and is disposed over the inorganic black matrix pattern 105 between the data line 130 and the outer common electrode 115. Therefore, the black matrix 172 of the invention has a narrower width than the black matrix 83 of FIG. 4 of the related art.

Accordingly, the LCD device 100 of the invention has an improved aperture ratio as compared with the LCD device 40 FIG. 4 of the related art.

A method of fabricating an LCD device according to the invention will be explained with reference to accompanying drawings.

FIGS. 7A to 7E are plan views of one pixel region for the LCD device in steps of a method of fabricating the same according to the embodiment of the invention. FIGS. 8A to 8K are cross-sectional views taken along the line VI-VI of FIG. 5 in steps of a method of fabricating the LCD device according to the embodiment of the invention. Here, a method of manufacturing the array substrate will be mainly explained.

Figure 7A:
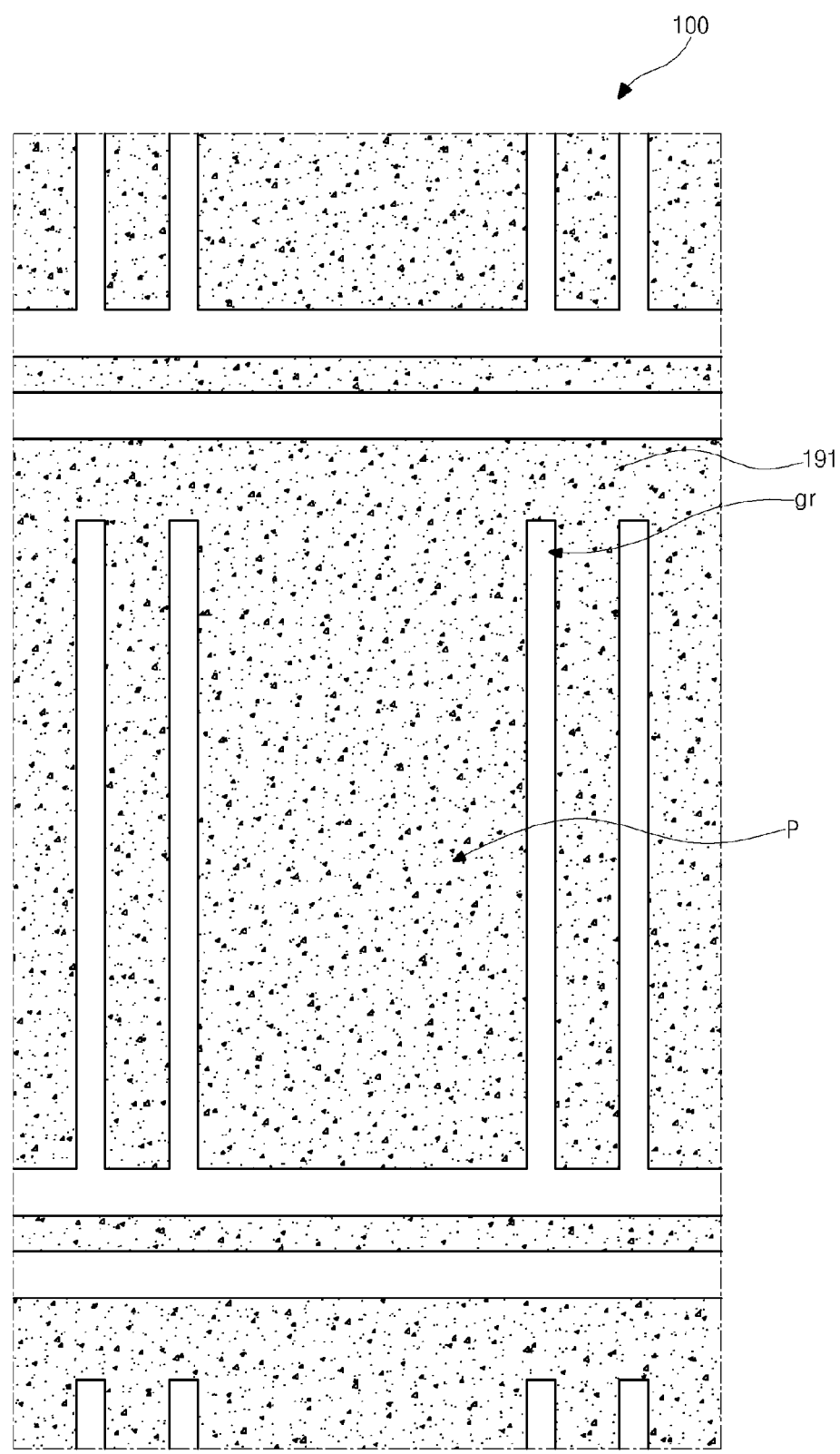
FIGS. 7A to 7E are plan views of one pixel region for the LCD device in steps of a method of fabricating the same according to the embodiment of the invention.

In FIG. 7A and FIG. 8A, an inorganic black material layer 103 is formed on a substantially entire surface of a first substrate 101 by depositing a black inorganic material, for example, germanium (Ge). Here, the first substrate 101 may be formed of a transparent insulating material such as glass or plastic.

A photoresist layer (not shown) is formed on the inorganic black material layer 103 by applying photoresist to the inorganic black material layer 103. Then, the photoresist layer is exposed to light through a photo-mask and is developed to thereby form a photoresist pattern 191. The photoresist pattern 191 corresponds to first areas excluding second areas where a gate line, a common line and outer common electrodes will be formed later, and the inorganic black material layer 103 corresponding to the second areas where the gate line, the common line and the outer common electrodes will be formed later is exposed.

In FIG. 7A and FIG. 8B, the inorganic black material layer 103 of FIG. 8A exposed by the photoresist pattern 191 is removed to thereby expose the inner surface of the first substrate 101. Here, the remaining inorganic black material layer 103, which is shielded by the photoresist pattern 191 and is not etched, becomes an inorganic black material pattern 104. The inorganic black material layer 103 of FIG. 8A may be over-etched such that the inorganic black material pattern 104 has an under cut structure in which the inorganic black material pattern 104 has a narrower width than the photoresist pattern 191. In case that the inorganic black material pattern 104 has the narrower width than the photoresist pattern 191, the area between the outer common electrodes and a data line to be formed later may not be completely shielded by the inorganic black patter 105 of FIG. 5, and there may be light leakage. In figures, the inorganic black material layer 103 of FIG. 8A is not over-etched, and the inorganic black material pattern 104 and the photoresist pattern 191 have the same width.

Figure 8C:
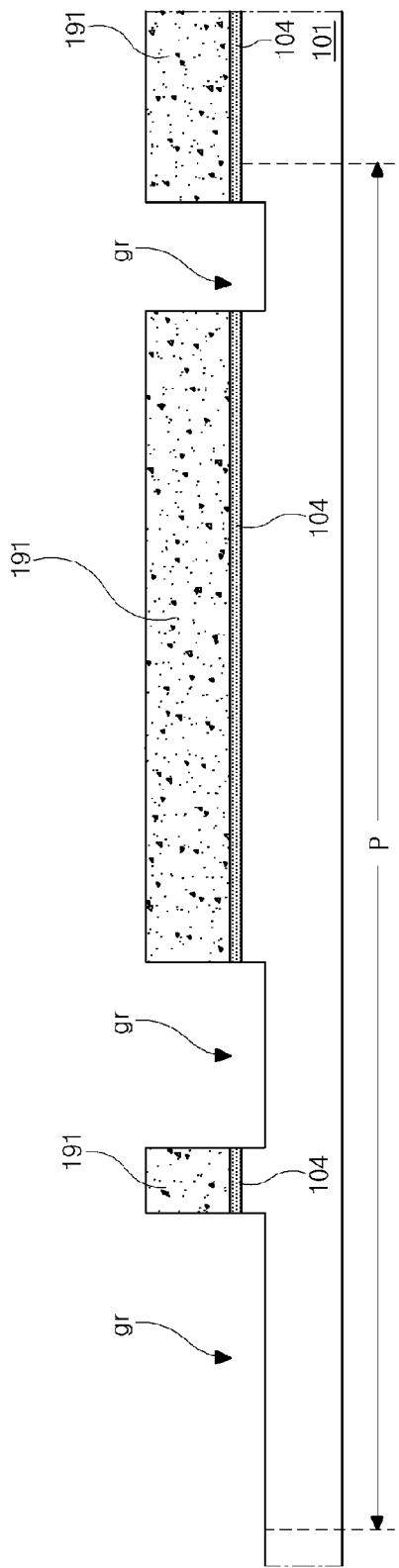

Next, in FIG. 7A and FIG. 8C, the inner surface of the first substrate 101 exposed by the inorganic black material pattern 104 is removed to thereby form the grooves gr corresponding to the second area where the gate line, the common line and the outer common electrodes. If the first substrate 101 is formed of glass, the inner surface of the first substrate 101 exposed by the inorganic black material pattern 104 may be exposed to hydrogen fluoride (HF). If the first substrate 101 is formed of plastic, the inner surface of the first substrate 101 may be exposed to another etchant.

Figure 8D:
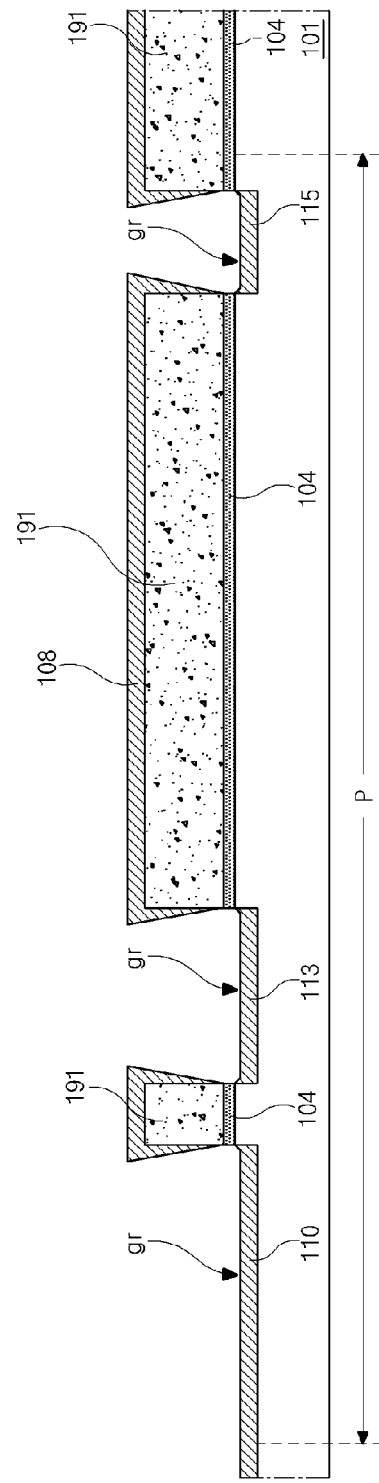

In FIG. 7A and FIG. 8D, a first metallic layer 108 is formed on a substantially entire surface of the first substrate 101 including the photoresist pattern 191 and the grooves gr by depositing a first metallic material, which may be one or more selected from aluminum (Al), aluminum alloy such as aluminum neodymium (AlNd), copper (Cu), copper alloy and chromium (Cr). Here, the first metallic layer 108 may have a single-layered structure.

In the meantime, the first metallic layer 108 may be formed by a sputtering method, and the first metallic layer 108 may be disconnected due to a step between the grooves gr and the photoresist pattern 191. More particularly, a portion of the first metallic layer 108 on the photoresist pattern 191 is disconnected with a portion of the first metallic layer 108 in the grooves gr. When the first metallic layer 108 is formed by a sputtering method, the first metallic material may be mainly deposited along a normal direction to the first substrate 101 and may be less deposited at side surfaces of the photoresist pattern 191, which is parallel to the normal direction to the first substrate 101. Moreover, the closer to the inner surface of the first substrate 101 it may be, the less the first metallic material may be deposited. Thus, there may be disconnection of the first metallic layer 108 as shown in FIG. 8D.

Here, portions of the first metallic layer 108 in the grooves gr become a gate line 109, a gate electrode 110, a common line 113 and an outer common electrode 115, respectively. In the embodiment of the invention, a portion of the gate line 109 functions as a gate electrode 110.

Figure 7B:
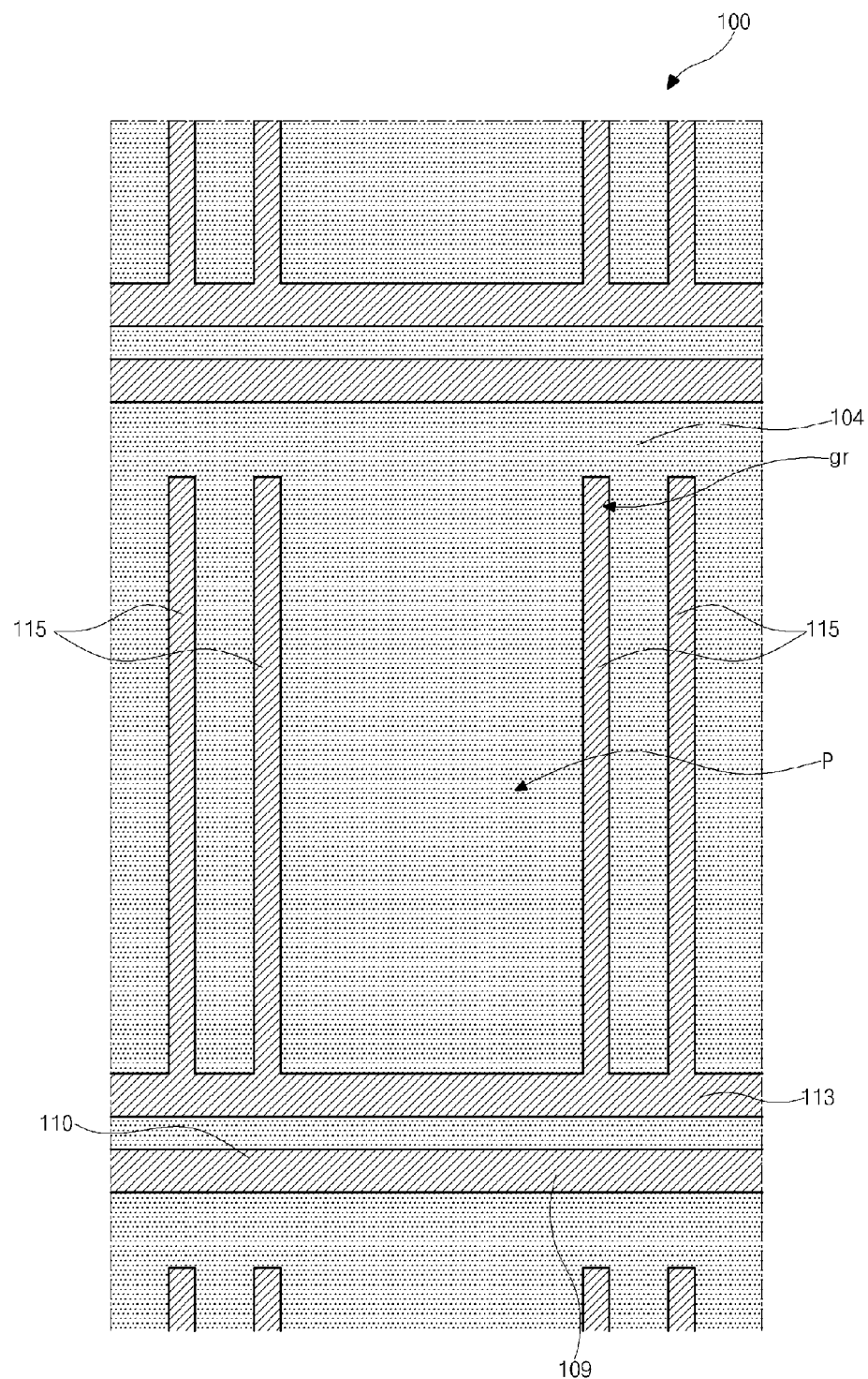
Figure 8E:
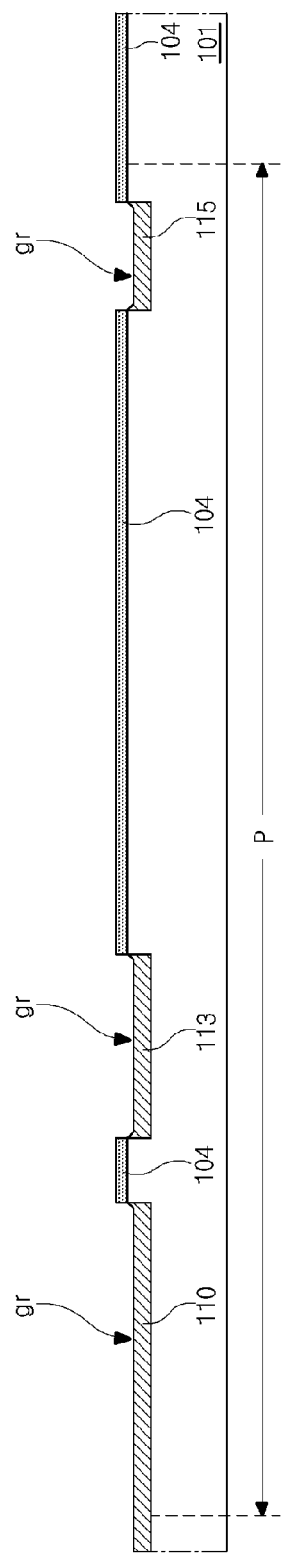

In FIG. 7B and FIG. 8E, a developing process is performed to the first substrate 101, which includes the gate line 109, the common line 113 and the outer common electrode 115 in the grooves gr and the first metallic layer 108 of FIG. 8D on the photoresist pattern 191 of FIG. 8D, thereby removing the photoresist pattern 191 of FIG. 8D.

At this time, the photoresist pattern 191 of FIG. 8D reacts with a developer and comes off from the inner surface of the first substrate 101, and the first metallic layer 108 of FIG. 8D on the photoresist pattern 191 of FIG. 8D is also removed together. Therefore, the gate line 109, the common line 113 and the outer common electrode 115 in the grooves gr and the inorganic black material pattern 104 remain on the first substrate 101. The process of removing the photoresist pattern 191 of FIG. 8D and the material layer thereon at the same time may be referred to as a liftoff process.

Figure 7C:
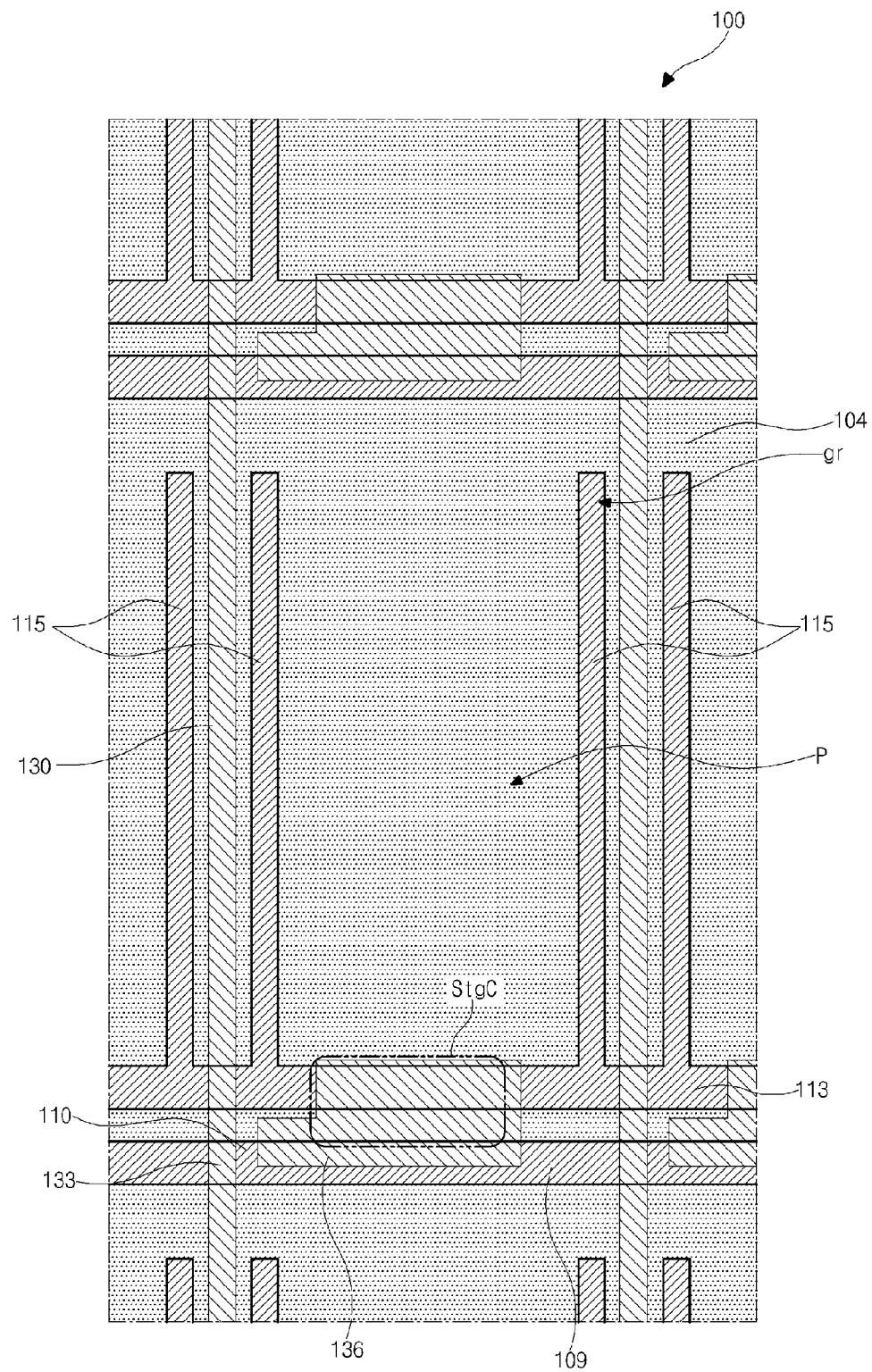
Figure 8F:
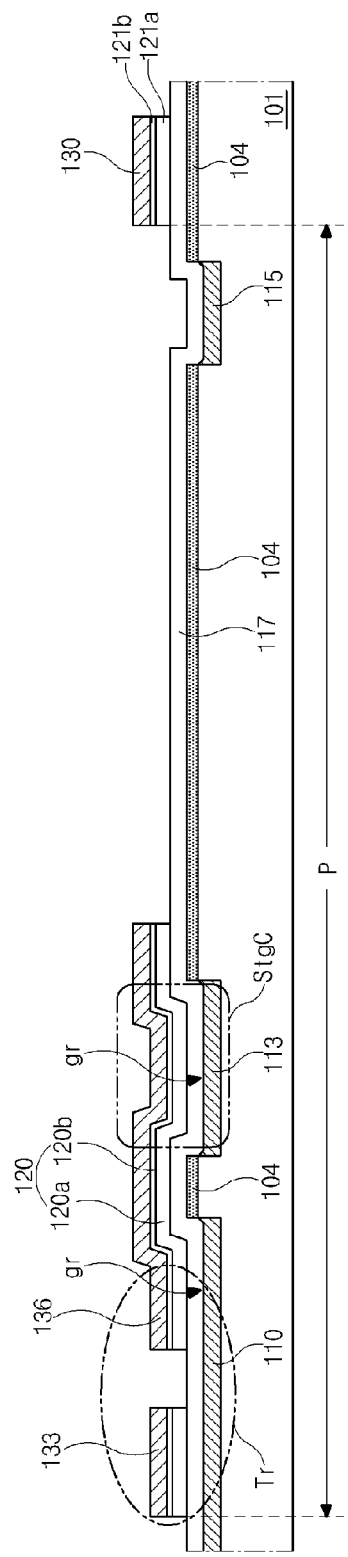

In FIG. 7C and FIG. 8F, a gate insulating layer 117 is formed on a substantially entire surface of the first substrate 101 including the gate line 109, the common line 113, the outer common electrode 115 and the inorganic black material pattern 104 by depositing an inorganic insulating material, for example, silicon oxide ($SiO_2$) or silicon nitride (SiNx).

Next, an intrinsic amorphous silicon layer (not shown), an impurity-doped amorphous silicon layer (not shown) and a second metallic layer (not shown) are formed on the gate insulating layer 117 and then are patterned through one mask process including a halftone light-exposure step or a diffraction light-exposure step or two mask processes to thereby form an active layer 120a, ohmic contact layers 120b and source and drain electrodes 133 and 136 in the pixel region P. The active layer 120a is formed of intrinsic amorphous silicon and corresponds to the gate electrode 110. The ohmic contact layers 120b are formed of impurity-doped amorphous silicon and are spaced apart from each other on the active layer 120a. The active layer 120a and the ohmic contact layers 120b may be referred to as a semiconductor layer 120. The source and drain electrodes 133 and 136 are spaced apart from each other on the ohmic contact layers 120b.

The gate electrode 110, the gate insulating layer 117, the active layer 120a, the ohmic contact layers 120b and the source and drain electrodes 133 and 136 constitute a thin film transistor Tr, which is a switching element.

In addition, a data line 130 is formed at the same time. The data line 130 crosses the gate line 109 to define the pixel region P. In the embodiment of the invention, a portion of the data line 130 crossing the gate line 109 acts as the source electrode 133, and the source electrode 133 may extend from the data line 130.

The drain electrode 136 extends to an area where the common line 133 is formed and overlaps the common line 133 with the gate insulating layer 117 therebetween to form a storage capacitor StgC.

Here, the second metallic layer (not shown), the impurity-doped amorphous silicon layer (not shown) and the intrinsic amorphous silicon layer (not shown) are removed through one mask process including a halftone light-exposure step or a diffraction light-exposure step. A mask including a light-blocking portion, a light-transmitting portion and a half light-transmitting portion is used in the mask process. The half light-transmitting portion may include a halftone layer or slits. At this time, first and second dummy patterns 121a and 121b are formed under the data line 130. The first dummy pattern 121a is formed of the same material as the active layer 120a, and the second dummy pattern 121b is formed of the same material as the ohmic contact layers 120b.

On the other hand, the second metallic layer (not shown), the impurity-doped amorphous silicon layer (not shown) and the intrinsic amorphous silicon layer (not shown) may be removed through two mask processes, and the first and second dummy patterns 121a and 121b under the data line 130 may be omitted.

Figure 8G:
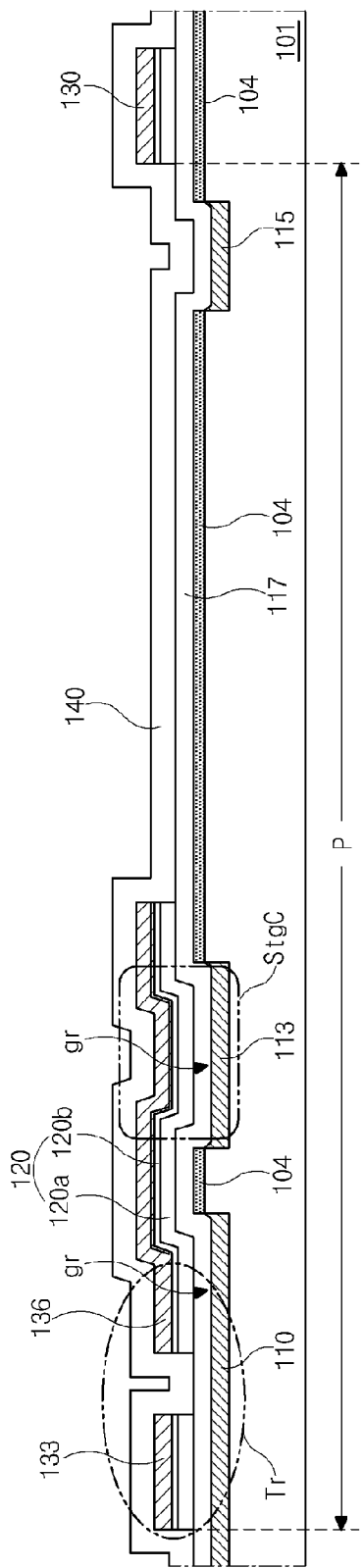

Next, in FIG. 7C and FIG. 8G, a passivation layer 140 is formed on a substantially entire surface of the first substrate 101 including the thin film transistor Tr and the data line 130 by depositing an inorganic material, for example, silicon oxide ($SiO_2$) or silicon nitride (SiNx).

Figure 7D:
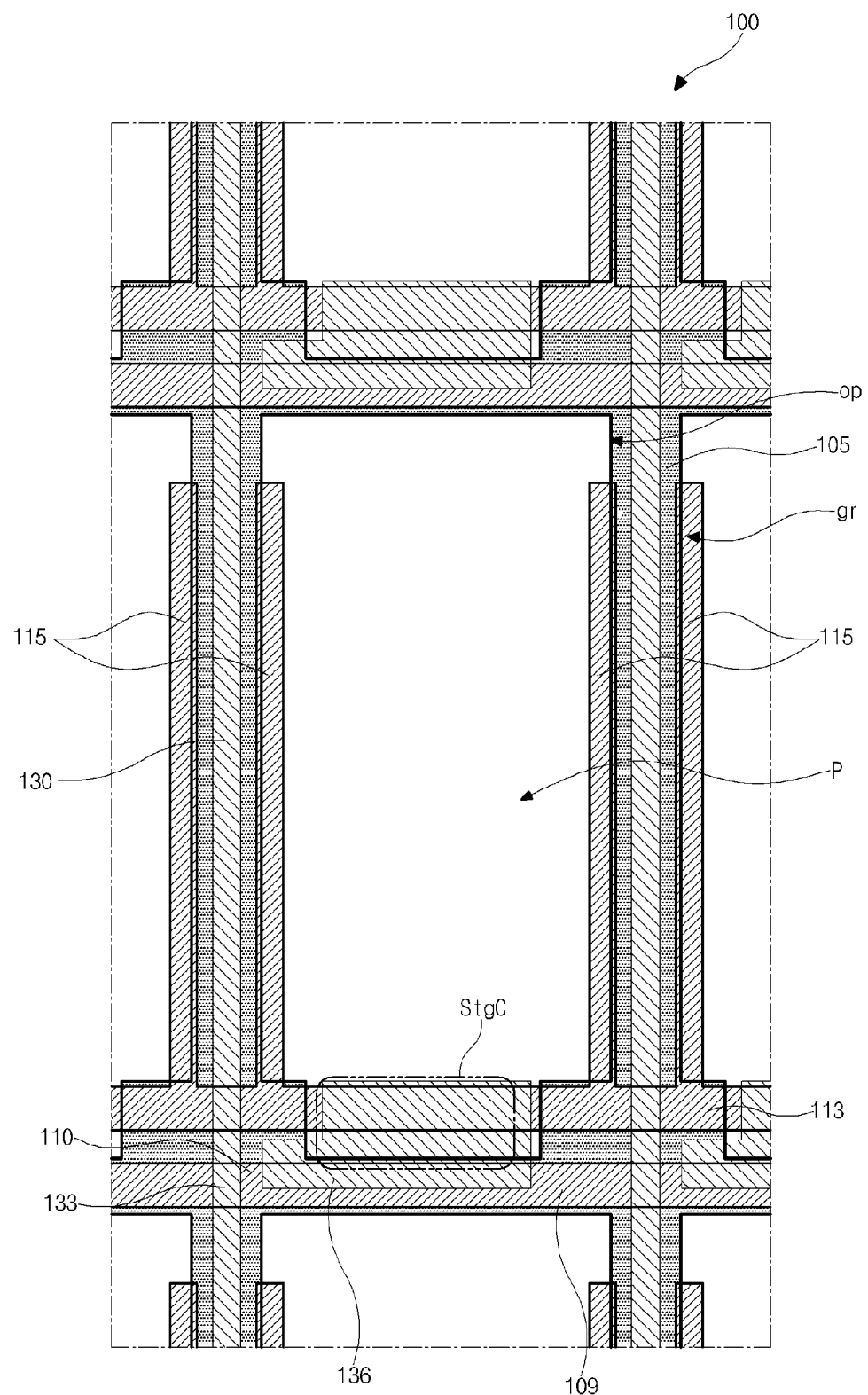
Figure 8H:
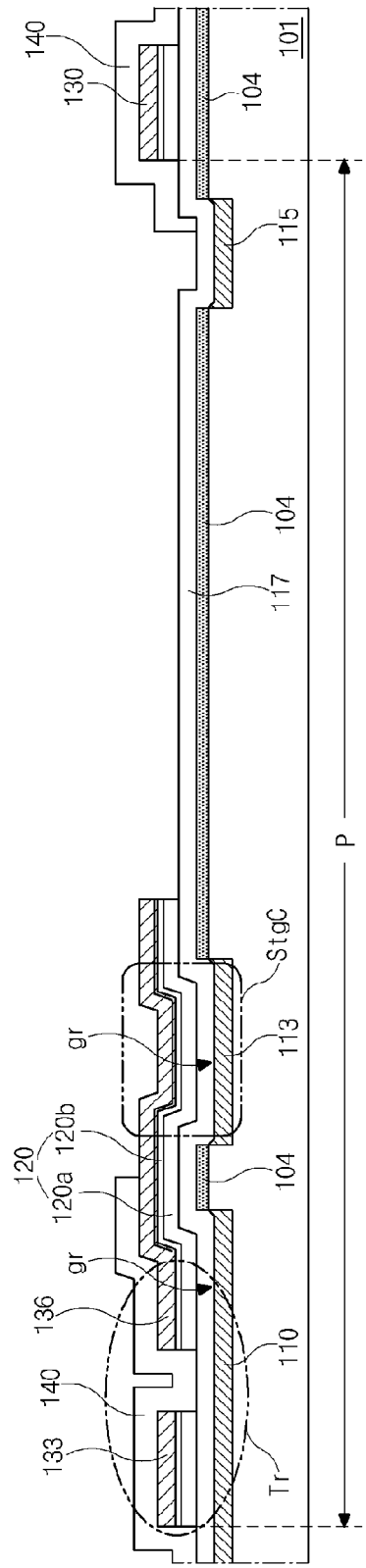
Figure 8I:
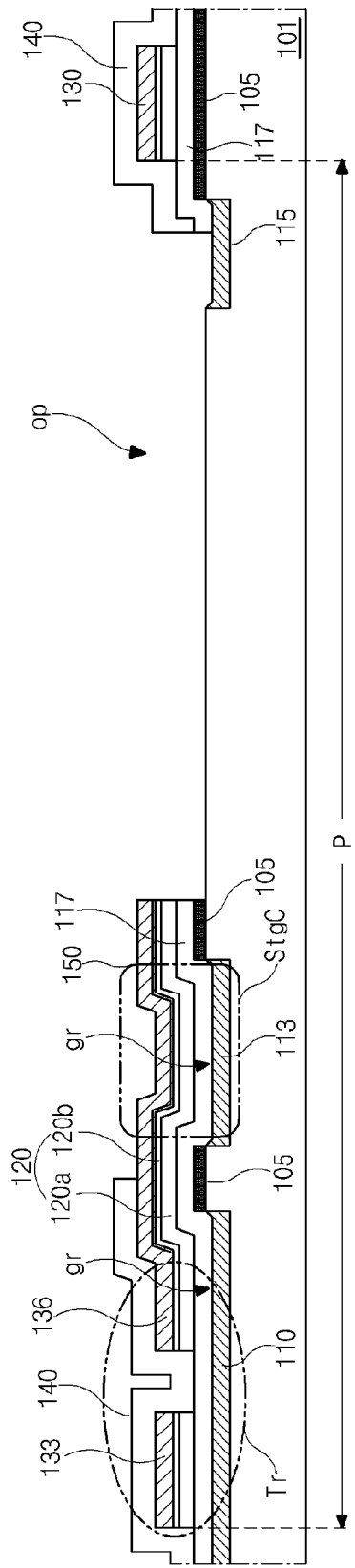

In FIG. 7D and FIGS. 8H and 8I, the passivation layer 140 is patterned through a mask process to thereby expose the gate insulating layer 117 and the one end of the drain electrode 136. Subsequently, the exposed gate insulating layer 117 and the inorganic black material pattern 104 of FIG. 8H are removed to thereby form the opening op exposing the inner surface of the first substrate 101. The opening op also partially exposes the outer common electrodes 115 in the pixel region P.

Finally, the passivation layer 140 remains on the boundaries of the pixel region P, that is, on the gate line 109 and the data line 130, and also remains on the source electrode 133, a portion of the drain electrode 136, and the active layer 120a exposed between the source and drain electrodes 133 and 136.

Additionally, the inorganic black material pattern 104 of FIG. 8H is patterned in this mask process to thereby form an inorganic black matrix pattern 105. As shown in the embodiment of the invention, when the inorganic black material pattern 104 of FIG. 8B has the same width as the photoresist pattern 191 of FIG. 8B, the inorganic black matrix pattern 105 completely shields the area between the outer common electrodes 115 and the data line 130. When the inorganic black material pattern 104 of FIG. 8B has a narrower width than the photoresist pattern 191 of FIG. 8B due to over-etching, the inorganic black matrix pattern 105 may partially shield the area between the outer common electrodes 115 and the data line 130, and thus a part of the area neighboring the outer common electrodes 115 is not shielded.

Figure 7E:
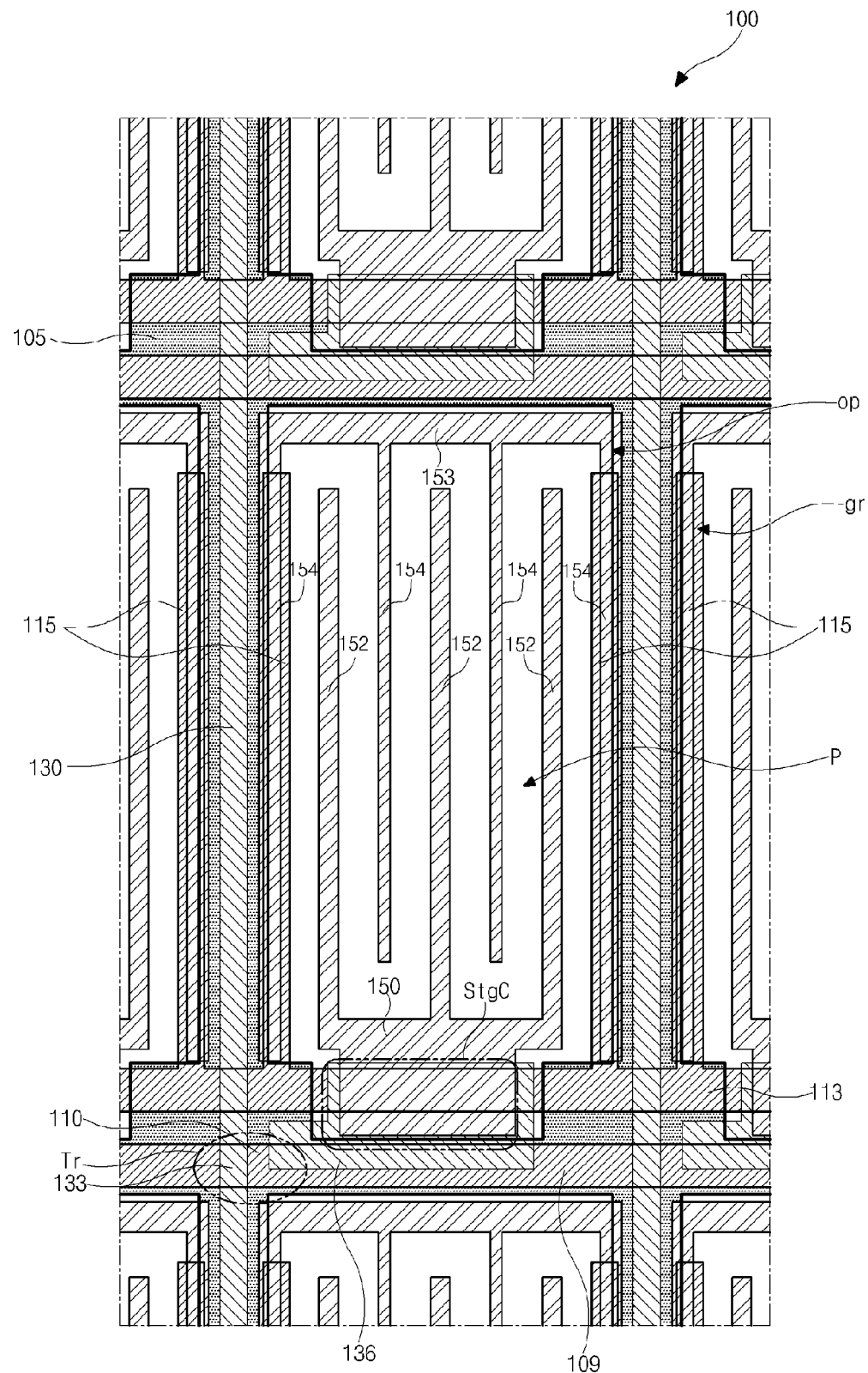
Figure 8J:
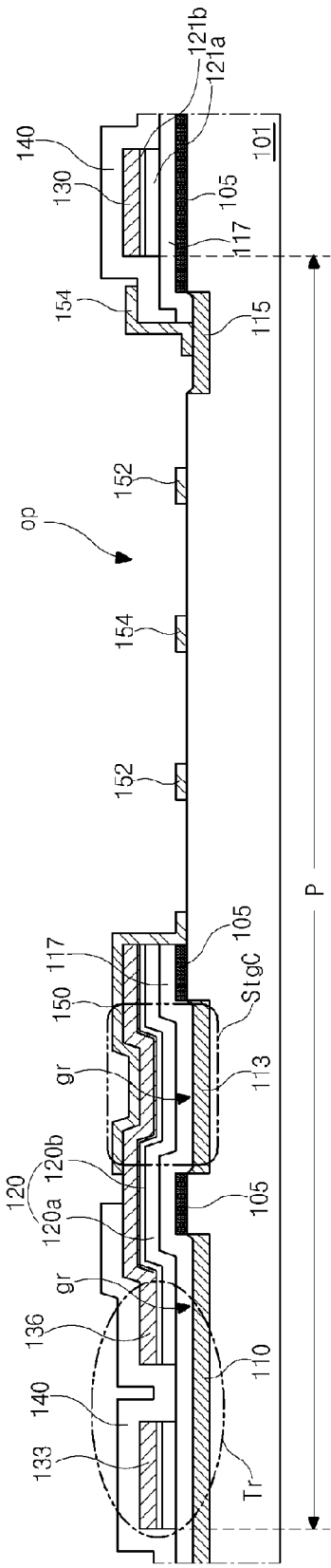

In FIG. 7E and FIG. 8J, an auxiliary pixel pattern 150, pixel electrodes 152, an auxiliary common pattern 153 and common electrodes 154 are formed in the opening op of the pixel region P by depositing and then patterning a transparent conductive material or a third metallic material on the first substrate 101 including the passivation layer 140 and the opening op. The auxiliary pixel pattern 150 contacts the one end of the drain electrode 136. The pixel electrodes 152 extend from the auxiliary pixel pattern 150 and are spaced apart from each other. The auxiliary common pattern 153 may be disposed at an upper side of the pixel region P opposite to a lower side of the pixel region P where the auxiliary pixel pattern 150. The common electrodes 154 extend from the auxiliary common pattern 153, and ends of the common electrodes 15 are connected to the auxiliary common pattern 153. The common electrodes 154 are spaced apart from each other. The pixel electrodes 152 and the common electrodes 154 are disposed directly on the inner surface of the first substrate 101 in the pixel region P and alternate one another.

The transparent conductive material may be indium tin oxide (ITO) or indium zinc oxide (IZO). The third metallic material may be molybdenum (Mo) or molybdenum alloy such as molybdenum titanium (MoTi).

Here, two of the common electrodes 154 overlap the outer common electrodes 115. The common electrodes 154 overlapping the outer common electrodes 115 also overlap the inorganic black matrix pattern 105, which is formed between the data line 130 and the outer common electrodes 115. That is, one side of the common electrodes 154 overlapping the outer common electrodes 115 and the inorganic black matrix pattern 105 is disposed over the outer common electrodes 115 and the other side is disposed over the inorganic black matrix pattern 105. Therefore, when the pixel electrodes 152 and the common electrodes 154 are formed of the third metallic material, light leakage in the area between the data line 130 and the outer common electrodes 115 is doubly prevented. Moreover, even though the inorganic black material pattern 104 of FIG. 8B has a narrower width than the photoresist pattern 191 of FIG. 8B and the inorganic black matrix pattern 105 partially shields the area between the outer common electrodes 115 and the data line 130, the partially shielded area between the outer common electrodes 115 and the data line 130 can be completely screened by the common electrodes 154 contacting the outer common electrodes 115. Accordingly, incident light through the area between the common line 130 and the outer common electrodes 115 can be blocked.

As stated above, an array substrate for the LCD device according to the embodiment of the invention is completed.

Figure 8K:
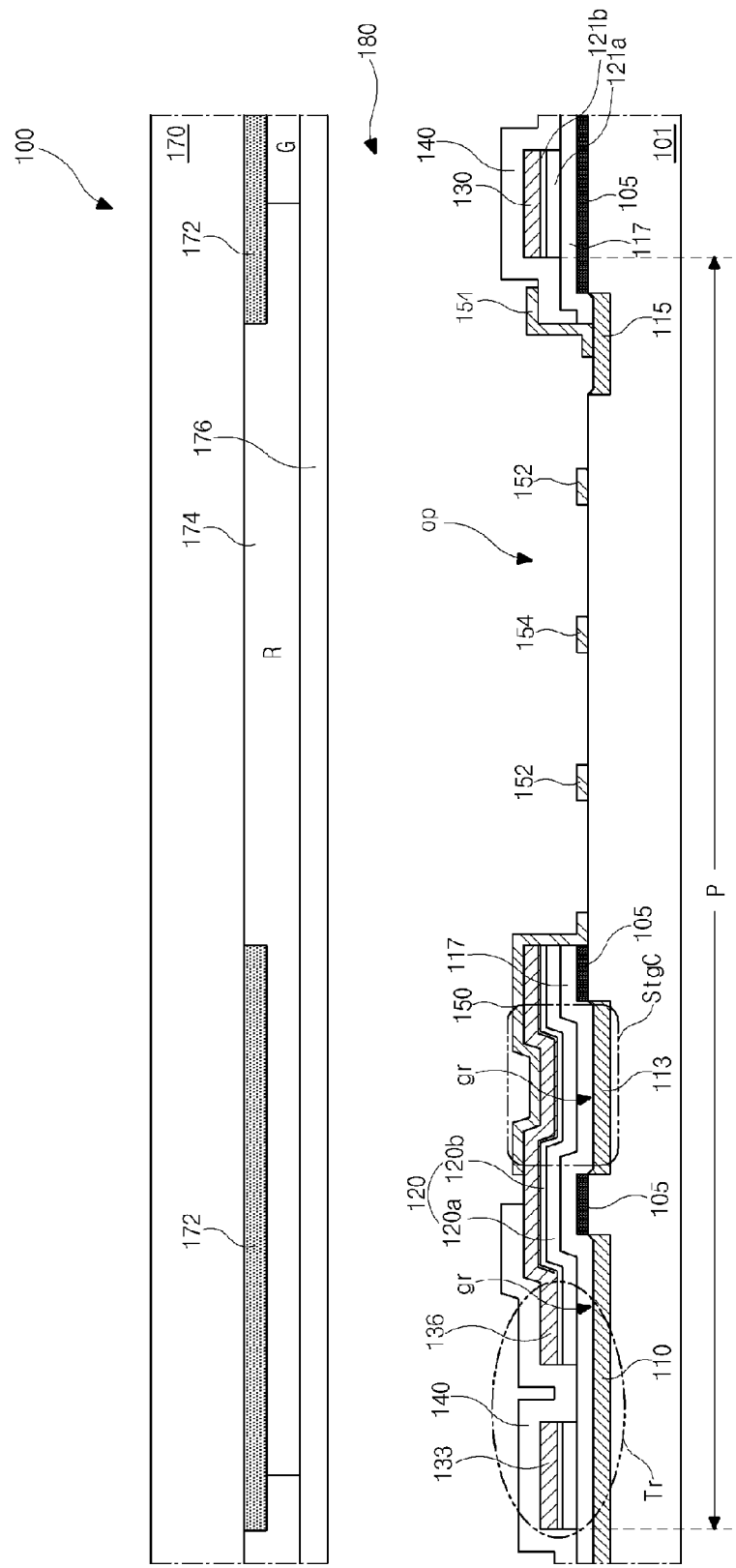

In FIG. 7E and FIG. 8K, a black matrix layer (not shown) is formed on an inner surface of a transparent second substrate 170 by depositing chromium (Cr) or chromium oxide (CrOx) or applying a black resin and then is patterned to thereby form a black matrix 172. The black matrix 172 corresponds to the gate line 109, the data line 130 and the thin film transistor Tr. Particularly, a side of the black matrix 172 overlapping the data line 130 is disposed over the outer common electrodes 115 neighboring the data line 130 or over the area between the data line 130 and the outer common electrodes 115 when a color filter substrate is attached with the array substrate.

Here, when the inorganic black material pattern 104 of FIG. 8B has the same width as the photoresist pattern 191 of FIG. 8B, the side of the black matrix 172 on the inner surface of the second substrate 170 can be disposed over and overlap the outer common electrodes 115 or can be disposed over and overlap the area between the data line 130 and the outer common electrodes 115. By the way, when the inorganic black material pattern 104 of FIG. 8B has a narrower width than the photoresist pattern 191 of FIG. 8B due to over-etching, it is desirable that the side of the black matrix 172 is disposed over and overlaps the outer common electrodes 115 to completely screen the part of the area between the data line 130 and the outer common electrodes 115 in which light leakage may occur.

However, if the pixel electrodes 152 and the common electrodes 154 are formed of the third metallic material, light leakage in the area between the data line 130 and the outer common electrodes 115 can be prevented by the common electrodes 154 overlapping the outer common electrodes 115. Therefore, the side of the black matrix 172 can overlap the outer common electrodes 115 or overlap the area between the data line 130 and the outer common electrodes 115.

Next, a color filter layer 174 is formed on the black matrix 172. The color filter layer 174 includes red, green and blue color filter patterns R, G and B, which correspond to respective pixel regions P and are sequentially and repeatedly arranged. An overcoat layer 176 is formed on the color filter layer 174.

Accordingly, the color filter substrate is completed.

Then, the array substrate and the color filter substrate are arranged such that the pixel electrodes 152 face the overcoat layer 176, and a liquid crystal layer 180 is interposed between the array substrate and the color filter substrate. The array substrate and the color filter substrate are attached by a seal pattern (not shown), which is formed therebetween along their peripheries, and thus the LCD device 100 is fabricated.

In the LCD device according to the invention, since the inorganic black matrix pattern shields the area between the data line and the outer common electrodes, light leakage in the area can be prevented. Therefore, the black matrix on the color filter substrate for preventing light leakage can have a reduced width, and the aperture ratio can be improved.

Moreover, the parasitic capacitance between the data line and the outer common electrodes can be decreased due to the inorganic black matrix pattern. Furthermore, the area between the data line the outer common electrodes can be reduced due to the decrease of the parasitic capacitance as compared with the related art, and the aperture ratio can be more increased.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   first and second substrates facing each other, wherein a pixel region is defined on the first and second substrates;
   first and second grooves formed on an inner surface of the first substrate;
   a gate line formed in the first groove along a direction;
   a common line formed in the second groove and parallel to the gate line;

a data line crossing the gate line to define the pixel region;
a thin film transistor connected to the gate line and the data line;
a light-shielding pattern of a black inorganic material and around the gate line, the data line and the common line;
third grooves formed on an inner surface of the first substrate and in the pixel region, the third grooves extending from the second groove;
outer common electrodes in the third grooves and extending from the common line;
a passivation layer over the gate line and the data line; and
pixel electrodes directly on and contacting the inner surface of the first substrate in the pixel region and electrically connected to a drain electrode of the thin film transistor.

2. The device according to claim 1, further comprising:
common electrodes directly on and contacting the inner surface of the first substrate and electrically connected to the outer common electrodes, the common electrodes alternating with the pixel electrodes;
a black matrix on an inner surface of the second substrate, the black matrix corresponding to the gate line and the data line;
a color filter layer on the black matrix and corresponding to the pixel region; and
a liquid crystal layer between the first and second substrates,
wherein the data line is disposed between one of the outer common electrodes and an outer common electrode of another pixel region adjacent to the pixel region, and one side of the black matrix overlapping the data line is disposed over the one of the outer common electrodes or over the light-shielding pattern.

3. The device according to claim 2, wherein one side of the common electrodes contacting the outer common electrodes is disposed over the outer common electrodes and the other side of the common electrodes contacting the outer common electrodes is disposed over the light-shielding pattern.

4. The device according to claim 2, wherein the common electrodes extend from an auxiliary common pattern on the inner surface of the first substrate in the pixel region, and the pixel electrodes extend from an auxiliary pixel pattern on the inner surface of the first substrate in the pixel region, wherein the auxiliary pixel pattern contacts the drain electrode.

5. The device according to claim 2, wherein the pixel electrodes and the common electrodes are formed of one of a transparent conductive material including indium tin oxide and a metallic material including molybdenum and molybdenum alloy.

6. The device according to claim 1, wherein the light-shielding pattern is directly on and contacts the inner surface of the first substrate.

7. The device according to claim 1, wherein a drain electrode of the thin film transistor overlaps the common line with a gate insulating layer therebetween to form a storage capacitor.

8. The device according to claim 1, wherein the black inorganic material includes germanium.

9. A fabricating method of a liquid crystal display device, comprising:
forming an inorganic black material layer on a first substrate, on which a pixel region is defined;
forming a photoresist pattern on the inorganic black material layer;
removing the inorganic black material layer using the photoresist pattern as an etching mask to expose an inner surface of the first substrate;
forming first and second grooves by removing the exposed inner surface of the first substrate;
forming a gate line and a common line in the first groove and the second groove, respectively, and removing the photoresist pattern;
forming a data line crossing the gate line to define the pixel region; and
forming a thin film transistor connected to the gate line and the data line.

10. The method according to claim 9, wherein forming the first and second grooves includes forming third grooves extending from the second groove, and wherein forming the gate line and the common line includes forming outer common electrodes extending from the common line in the third grooves.

11. The method according to claim 10, further comprising:
forming a passivation layer over the data line and the thin film transistor;
forming an opening, which exposes the inner surface of the first substrate, the outer common electrodes and a drain electrode of the thin film transistor in the pixel region, and an inorganic black matrix pattern by removing the passivation layer, a gate insulting layer and the inorganic black material layer; and
forming pixel electrodes in the inner surface of the first substrate, the pixel electrodes electrically connected to the drain electrode.

12. The method according to claim 11, further comprising:
forming common electrodes on the inner surface of the first substrate, the common electrodes electrically connected to the outer common electrodes and alternating with the pixel electrodes;
forming a black matrix on an inner surface of a second substrate, the black matrix corresponding to the gate line and the data line;
forming a color filter layer on the black matrix and corresponding to the pixel region; and
attaching the first substrate and the second substrate with a liquid crystal layer interposed therebetween,
wherein one side of the black matrix overlapping the data line is disposed over one of the outer common electrodes or over the inorganic black matrix pattern.

13. The method according to claim 12, wherein the pixel electrodes and the common electrodes are formed of one of a transparent conductive material including indium tin oxide and a metallic material including molybdenum and molybdenum alloy.

14. The method according to claim 12, wherein one side of the common electrodes contacting the outer common electrodes is disposed over one of the outer common electrodes and the other side of the common electrodes contacting the outer common electrodes is disposed over the inorganic black matrix pattern.

15. The method according to claim 9, wherein forming the gate line and the common line and removing the photoresist pattern includes depositing a metallic layer on a substantially entire surface of the first substrate including the photoresist pattern such that the metallic layer has disconnection at side surfaces of the photoresist pattern and simultaneously removing the photoresist pattern and the metallic layer thereon by a liftoff method.

16. The method according to claim 9, wherein forming the thin film transistor includes sequentially forming an active layer, ohmic contact layers, and source and drain electrodes on a gate insulating layer corresponding to the gate line, wherein the drain electrode overlaps the common line with the gate insulating layer therebetween to thereby form a storage capacitor.

* * * * *